(12) United States Patent
Walker et al.

(10) Patent No.: US 6,841,813 B2
(45) Date of Patent: Jan. 11, 2005

(54) TFT MASK ROM AND METHOD FOR MAKING SAME

(75) Inventors: Andrew J. Walker, Mountain View, CA (US); Christopher Petti, Mountain View, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 216 days.

(21) Appl. No.: 09/983,988

(22) Filed: Oct. 26, 2001

(65) Prior Publication Data

US 2003/0030074 A1 Feb. 13, 2003

Related U.S. Application Data

(63) Continuation-in-part of application No. 09/927,648, filed on Aug. 13, 2001, and a continuation of application No. 09/961,278, filed on Sep. 25, 2001, now Pat. No. 6,593,624.

(51) Int. Cl.$^7$ ............................................. H01L 29/786
(52) U.S. Cl. .......................... 257/278; 257/74; 257/390
(58) Field of Search .............................. 257/7, 74, 278, 257/390, E21.614, E21.662, E21.667, E21.671, E21.677, E27.026, E27.103, E33.077, E51.005

(56) References Cited

U.S. PATENT DOCUMENTS

| | | |
|---|---|---|
| 3,414,892 A | 12/1968 | McCormack et al. |
| 3,432,827 A | 3/1969 | Samo |
| 3,571,809 A | 3/1971 | Nelson |
| 3,573,757 A | 4/1971 | Adams |
| 3,576,549 A | 4/1971 | Hess |
| 3,582,908 A | 6/1971 | Koo |
| 3,629,863 A | 12/1971 | Neale |
| 3,634,929 A | 1/1972 | Yoshida et al. |
| 3,671,948 A | 6/1972 | Cassen et al. |
| 3,699,543 A | 10/1972 | Neale |
| 3,717,852 A | 2/1973 | Abbas et al. |
| 3,728,695 A | 4/1973 | Frohman-Bentchkowsky |
| 3,787,822 A | 1/1974 | Rioult |
| 3,846,767 A | 11/1974 | Cohen |
| 3,863,231 A | 1/1975 | Taylor |
| 3,877,049 A | 4/1975 | Buckley |
| 3,886,577 A | 5/1975 | Buckley |
| 3,922,648 A | 11/1975 | Buckley |
| 3,980,505 A | 9/1976 | Buckley |
| 3,990,098 A | 11/1976 | Mastrangelo |
| 4,146,902 A | 3/1979 | Tanimoto et al. |
| 4,177,475 A | 12/1979 | Holmberg |
| 4,203,123 A | 5/1980 | Shanks |
| 4,203,158 A | 5/1980 | Frohman-Bentchkowsky et al. |

(List continued on next page.)

FOREIGN PATENT DOCUMENTS

| | | |
|---|---|---|
| EP | 0 073 486 A2 | 8/1982 |
| EP | 0 387 834 A2 | 9/1990 |
| EP | 0 395 886 A2 | 11/1990 |
| EP | 0 516 866 A1 | 12/1992 |
| EP | 0 606 653 A1 | 7/1994 |
| EP | 0 644 548 A2 | 9/1994 |
| EP | 0 800 137 A1 | 3/1997 |
| JP | 6-22352 | 2/1985 |
| JP | 61-222216 | 10/1986 |
| JP | 63-52463 | 3/1998 |
| WO | WO 94/26083 | 11/1994 |

OTHER PUBLICATIONS

"3D Chip–On–Chip Stacking," Semiconductor International, Dec. 1991.

(List continued on next page.)

*Primary Examiner*—George Fourson
*Assistant Examiner*—Joannie Adelle Garcia
(74) *Attorney, Agent, or Firm*—Foley & Lardner LLP

(57) ABSTRACT

There is provided a monolithic three dimensional TFT mask ROM array. The array includes a plurality of device levels. Each of the plurality of device levels contains a first set of enabled TFTs and a second set of partially or totally disabled TFTs.

24 Claims, 9 Drawing Sheets

U.S. PATENT DOCUMENTS

| | | |
|---|---|---|
| 4,272,880 A | 6/1981 | Pashley |
| 4,281,397 A | 7/1981 | Neal et al. |
| 4,419,741 A | 12/1983 | Stewart et al. |
| 4,420,766 A | 12/1983 | Kasten |
| 4,442,507 A | 4/1984 | Roesner |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,500,905 A | 2/1985 | Shibata |
| 4,507,757 A | 3/1985 | McElroy |
| 4,535,424 A | 8/1985 | Reid |
| 4,543,594 A | 9/1985 | Mohsen et al. |
| 4,569,121 A | 2/1986 | Lim et al. |
| 4,630,096 A | 12/1986 | Drye |
| 4,646,266 A | 2/1987 | Ovshinsky et al. |
| 4,672,577 A | 6/1987 | Hirose |
| 4,677,742 A | 7/1987 | Johnson |
| 4,710,798 A | 12/1987 | Marcantonio |
| 4,729,005 A * | 3/1988 | Wei et al. .................. 327/515 |
| 4,811,082 A | 3/1989 | Jacobs |
| 4,811,114 A | 3/1989 | Yamamoto et al. |
| 4,820,657 A | 4/1989 | Hughes et al. |
| 4,823,181 A | 4/1989 | Mohsen et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 5,001,539 A | 3/1991 | Inoue et al. |
| 5,070,383 A | 12/1991 | Sinar et al. |
| 5,070,384 A | 12/1991 | McCollum et al. |
| 5,089,862 A | 2/1992 | Warner, Jr. et al. |
| 5,091,762 A * | 2/1992 | Watanabe .................. 257/71 |
| 5,160,987 A | 11/1992 | Pricer et al. |
| 5,191,405 A | 3/1993 | Tomita et al. |
| 5,202,754 A | 4/1993 | Bertin et al. |
| 5,266,912 A | 11/1993 | Kledzik |
| 5,283,468 A | 2/1994 | Kondo et al. |
| 5,306,935 A | 4/1994 | Esquivel et al. |
| 5,311,039 A | 5/1994 | Kimura et al. |
| 5,334,880 A | 8/1994 | Abadeer et al. |
| 5,383,149 A | 1/1995 | Hong |
| 5,391,518 A | 2/1995 | Bhushan |
| 5,391,907 A | 2/1995 | Jang |
| 5,398,200 A | 3/1995 | Mazure et al. |
| 5,422,435 A | 6/1995 | Takiar et al. |
| 5,426,566 A | 6/1995 | Beilstein, Jr. |
| 5,427,979 A | 6/1995 | Chang |
| 5,434,745 A | 7/1995 | Shokrgozar et al. |
| 5,441,907 A | 8/1995 | Sung et al. |
| 5,453,952 A | 9/1995 | Okudaira et al. |
| 5,455,455 A | 10/1995 | Kurtz et al. |
| 5,463,244 A | 10/1995 | De Araujo et al. |
| 5,468,997 A | 11/1995 | Imai et al. |
| 5,471,090 A | 11/1995 | Deutsch |
| 5,481,133 A | 1/1996 | Hsu |
| 5,495,398 A | 2/1996 | Takiar et al. |
| 5,502,289 A | 3/1996 | Takiar et al. |
| 5,523,622 A | 6/1996 | Harada et al. |
| 5,523,628 A | 6/1996 | Williams et al. |
| 5,535,156 A | 7/1996 | Levy et al. |
| 5,536,968 A | 7/1996 | Crafts et al. |
| 5,552,963 A | 9/1996 | Burns |
| 5,561,622 A | 10/1996 | Bertin et al. |
| 5,572,046 A | 11/1996 | Takemura |
| 5,581,498 A | 12/1996 | Ludwig et al. |
| 5,585,675 A | 12/1996 | Knopf |
| 5,654,220 A | 8/1997 | Leedy |
| 5,675,547 A | 10/1997 | Koga |
| 5,693,552 A | 12/1997 | Hsu |
| 5,696,031 A | 12/1997 | Wark |
| 5,703,747 A | 12/1997 | Voldman et al. |
| 5,737,259 A | 4/1998 | Chang |
| 5,745,407 A | 4/1998 | Levy et al. |
| 5,751,012 A | 5/1998 | Wolstenholme et al. |
| 5,776,810 A | 7/1998 | Guterman et al. |
| 5,780,925 A | 7/1998 | Cipolla et al. |
| 5,781,031 A | 7/1998 | Bertin et al. |
| 5,801,437 A | 9/1998 | Burns |
| 5,835,396 A | 11/1998 | Zhang |
| 5,883,409 A | 3/1999 | Guterman et al. |
| 5,915,167 A | 6/1999 | Leedy |
| 5,930,608 A * | 7/1999 | Yamazaki et al. .......... 438/166 |
| 5,969,380 A | 10/1999 | Syyedy |
| 5,976,953 A | 11/1999 | Zavracky et al. |
| 5,978,258 A | 11/1999 | Manning |
| 5,981,974 A * | 11/1999 | Makita ...................... 257/72 |
| 5,985,693 A | 11/1999 | Leedy |
| 6,034,882 A | 3/2000 | Johnson et al. |
| 6,057,598 A | 5/2000 | Payne et al. |
| 6,072,234 A | 6/2000 | Camien et al. |
| 6,087,722 A | 7/2000 | Lee et al. |
| 6,107,666 A * | 8/2000 | Chang ....................... 257/391 |
| 6,110,278 A | 8/2000 | Saxena |
| 6,114,767 A * | 9/2000 | Nagai et al. ................ 257/758 |
| 6,133,640 A | 10/2000 | Leedy |
| 6,185,122 B1 | 2/2001 | Johnson et al. |
| 6,197,641 B1 | 3/2001 | Hergenrother et al. |
| 6,208,545 B1 | 3/2001 | Leedy |
| RE37,259 E | 7/2001 | Ovshinsky |
| 6,281,042 B1 | 8/2001 | Ahn et al. |
| 6,291,858 B1 | 9/2001 | Ma et al. |
| 6,307,257 B1 | 10/2001 | Huan et al. |
| 6,314,013 B1 | 11/2001 | Ahn et al. |
| 6,322,903 B1 | 11/2001 | Siniaguine et al. |
| 6,337,521 B1 | 1/2002 | Masuda |
| 6,351,028 B1 | 2/2002 | Akram |
| 6,353,265 B1 | 3/2002 | Michii |
| 6,355,501 B1 | 3/2002 | Fung et al. |
| 6,612,570 B1 | 9/2003 | Eide et al. |
| 6,653,733 B1 * | 11/2003 | Gonzalez et al. ........... 257/758 |
| 2001/0055838 A1 | 12/2001 | Walker et al. |
| 2002/0028541 A1 | 3/2002 | Lee et al. |

OTHER PUBLICATIONS

Richard W. Lay: "TRW Develops Wireless Multiboard Interconnect System," Electronic Engineering Times, Nov. 5, 1984.

Abou–Samra S.J.: "3D CMOS SOI for High Performance Computing", Low Power Electronics and Design Proceedings, 1998.

Yamazaki K.: "4–Layer 3–D IC Technologies for Parallel Signal Processing", International Electron Devices Meeting Technical Digest, Dec. 9–12, 1990, pp. 25.5.1–25.5.4.

Schlaeppi H.P.: "nd Core Memories using Multiple Coincidence", IRE Transactions on Electronic Computers, Jun. 1960, pp. 192–196.

Schlaeppppi H.P.: "Session V: Information Storage Techniques", International Solid–State Circuits Conference, Feb. 11, 1960, pp. 54–55.

De Graaf C. et al.: "A Novel High–Density, Low–Cost Diode Programmable Read Only Memory," IEDM, beginning at p. 189.

Peter K. Naji et al.: "A 256kb 3.0V 1T1MTJ Nonvolatile Magnetoresistive RAM," 2001 IEEE International Solid-State Circuits Conference, Digest of Technical Papers, ISSCC 2001/Session 7/Technology Directions: Advanced Technologies/7.6, Feb. 6, 2001, pp. 122–123 (including enlargement of figures, totaling 9 pages), and associated Visual Supplement, pp. 94–95,4040–405 (enlargements of slides submitted, totaling 25 pages).

Kim C. Hardee et al.: "A Fault–Tolerant 30 ns/375 mW 16K×1 NMOS Static RAM," IEEE Journal of Solid–State Circuits, Oct. 1981, vol. SC–16, No. 5, pp. 435–443.

Toshio Wada et al.: "A 15–ns 1024–Bit Fully Static MOS RAM," IEEE Journal of Solid–State Circuits, Oct. 1978, vol. SC–13, No. 5, pp. 635–639.

Camperi–Ginestet C.: "Vertical Electrical Interconnection of Compound Semiconductor Thin–Film Devices to Underlying Silicon Circuitry", IEEE Photonics Technology Letters, vol. 4, No. 9, Sep. 1992, pp. 1003–1006.

Akasaka Yoichi: Three–dimensional Integrated Circuit: Technology and Application Prospect, Microelectronics Journal, vol. 20, No.s 1–2, 1989, pp. 105–112.

Sakamoto Kaji: "Architecture des Circuits a Trois Dimension (Architecture of Three Dimensional Devices)", Bulletin of the Electrotechnical Laboratory, ISSN 0366–9092, vol. 51, No. 1, 1987, pp. 16–29.

Akasaka Yoichi: "Three–dimensional IC Trends", Proceedings of the IEEE, vol. 74, No. 12, 1986, pp. 1703–1714.

Carter William H.: "National Science Foundation (NSF) Forum on Optical Science and Engineering", Proceedings SPIE—The International Society for Optical Engineering, vol. 2524, Jul. 11–12, 1995, (Article by N. Joverst titled "Manufacturable Multi–Material Integration Compound Semi–conductor Devices Bonded to Silicon Circuity".

Hayashi Y.: "A New Three–Dimensional IC Fabrication Technology, Stacking Thin Film Dual–CMOS Layers", IEDM, 1991, pp. 25.6.1–25.6.4.

Reber M.: "Benefits of Vertically Stacked Integrated Circuits for Sequential Logic", IEEE, 1996, pp. 121–124.

Stern Jon M.: Design and Evaluation of an Epoxy Three–dimensional Multichip Module, IEEE Transactions on Components, Packaging, and Manufacturing Technology—Part B, vol. 19, No. 1, Feb. 1996, pp. 188–194.

Bertin Claude L.: "Evaluation of a Three–dimensional Memory Cube System", IEEE Transactions on Components, Hybrids, and Manufacturing Technology, vol. 16, No. 8, Dec. 1993, pp. 1006–1011.

Watanabe Hidehiro: "Stacked Capacitor Cells for High–density Dynamic RAMs", IEDM, 1988, pp. 600–603.

Web Page: "Stacked Memory Modules", IBM Technical Disclosure Bulletin, vol. 38, No. 5, 1995.

Thakur Shashidhar: "An Optimal Layer Assignment Algorithm for Minimizing Crosstalk for Three VHV Channel Routing", IEDM, 1995, pp. 207–210.

Terril Rob: "3D Packaging Technology Overview and Mass Memory Applications", IEDM, 1996, pp. 347–355.

Inoue Y.: "A Three–Dimensional Static RAM", IEEE Electron Device Letters, vol. 7, No. 5, May 1986, pp. 327–329.

Reber M.: "Benefits of Vertically Stacked Integrated Circuits for Sequential Logic", IEDM, 1996, pp. 121–124.

Kurokawa Takakazu: "3–D VLSI Technology in Japan and an Example: A Syndrome Decoder for Double Error Correction", FGCS—Future, Generation, Computer, Systems, vol. 4, No. 2, 1988, pp. 145–155, Amsterdam, The Netherlands.

Makiniak David: "Vertical Integration of Silicon Allows Packaging of Extremely Dense System Memory In Tiny Volumes: Memory–chip Stacks Send Density Skyward", Electronic Design, No. 17, Aug. 22, 1994, pp. 69–75, Cleveland Ohio.

Yamazaki K.: "Fabrication Technologies for Dual 4–KBIT Stacked SRAM", IEDM 16.8., 1986, pp. 435–438.

Pein Howard: "Performance of the 3–D PENCIL Flash EPROM Cell an Memory Array", IEEE Transactions on Electron Devices, vol. 42, No. 11, Nov. 1995, pp. 1982–1991.

Abstract Lomatch S.: "Multilayered Josephson Junction Logic and Memory Devices", Proceedings of the SPIE–The International Society for Optical Engineering vol. 2157, pp. 332–343.

Abstract Lu N.C.C.: "Advanced Cell Structures for Dynamic RAMs", IEEE Circuits and Devices Magazine, vol. 5, No. 1, Jan. 1989, pp. 27–36.

Abstract Sakamato K.: "Architecture of Three Dimensional Devices", Journal: Bulletin of the Electrotechnical Laboratory, vol. 51, No. 1, 1987, pp. 16–29.

Abstract "Wide Application of Low–Cost Associative Processing Associative Processing Seen", Electronic Engineering Times, Aug. 26, 1996, p. 43.

Abstract "Interconnects & Packaging", Electronic Engineering Times, Nov. 27, 1995, p. 43.

Abstract "Closing in on Gigabit DRAMs", Electronic Engineering Times, Nov. 27, 1995, p. 35.

Abstract "Module Pact Pairs Cubic Memory with Vision-Tek", Semiconductor Industry & Business Survey, vol. 17, No. 15, Oct. 23, 1995.

Abstract "Layers of BST Materials Push Toward 1 Gbit DRAM", Electronics Times, Oct. 19, 1995.

Abstract "Technologies Will Pursue Higher DRAM Densities", Electronic News (1991), Dec. 4, 1994, p. 12.

Abstract "Looking Diverse Storage", Electronic Engineering Times, Oct. 31, 1994, p. 44.

Abstract "Special Report: Memory Market Startups Cubic Memory: 3D Space Savers", Semiconductor Industry & Business Survey, vol. 16, No. 13, Sep. 12, 1994.

Abstract "Technique Boosts 3D Memory Density", Electronic Engineering Times, Aug. 29, 1994, p. 16.

Abstract "Memory Packs Poised 3D Use", Electronic Engineering Times, Dec. 7, 1992, p. 82.

Abstract "MCMs Hit the Road", Electronic Engineering Times, Jun. 15, 1992, p. 45.

Abstract "IEDM Ponders the 'Gigachip' Era", Electronic Engineering Times, Jan. 20, 1992, p. 33.

Abstract "Tech Watch: 1–Gbit DRAM in Sight", Electronic World News, Dec. 16, 1991, p. 20.

Abstract "MCMs Meld into Systems", Electronic Engineering Times, Jul. 22, 1991, p. 35.

Abstract "Systems EEs See Future in 3D", Electronic Engineering Times, Sep. 24, 1990, p. 37.

Chan et al. "Three Dimensional CMOS integrated Circuits on Large Grain Polysilicon Films" EEE, Hong Kong University of Science and Technology 2000 IEEE.

John H. Douglas: "The Route to 3–D Chips," High Technology, Sep. 1983, pp. 55–59, vol. 3, No. 9, High Technology Publishing Corporation, Boston, MA.

M. Arienzo et al.: "Diffusion of Arsenic in Bilayer Polycrystalline Silicon Films," J. Appl. Phys., Jan. 1984, pp. 365–369, vol. 55, No. 2, American Institute of Physics.

O. Bellezza et al.: "A New Self–Aligned Field Oxide Cell for Multimegabit Eproms," IEDM, pp. 579–582, IEEE.

S.D. Brotherton et al.: "Excimer–Laser–Annealed Poly–Si Thin–Film Transistors," IEEE Transactions on Electron Devices, Feb. 1993, pp. 407–413, vol. 40, No. 2, IEEE.

P. Candelier et al.: "Simplified 0.35–μm Flash EEPROM Process Using High–Temperature Oxide (HTO) Deposited by LPCVD as Interpoly Dielectrics and Peripheral Transistors Gate Oxide," IEEE Electron Device Letters, Jul. 1997, pp. 306–308, vol. 18, No. 7, IEEE.

Min Cao et al.: "A High–Performance Polysilicon ThinFilm Transistor Using XeCl Excimer Laser Crystallization of Pre–Patterned Amorphous Si Films," IEEE Transactions on Electron Devices, Apr. 1996, pp. 561–567, vol. 43, No. 4, IEEE.

Mino Cao et al.: "A Simple EEPROM Cell Using Twin Polysilicon Thin Film Transistors," IEEE Electron Device Letters, Aug. 1994, pp. 304–306, vol. 15, No. 8, IEEE.

Bomy Chen et al.: "Yield Improvement for a 3.5–ns BIC-MOS Technology in a 200–mm Manufacturing Line," IBM Technology Products, 1993, pp. 301–305, VLSITSA.

Victor W.C. Chan et al.: "Three Dimensional CMOS Integrated Circuits on Large Grain Polysilicon Films," IEDM, 2000, IEEE.

Boaz Eitan et al.: "Alternate Metal Virtual Ground (AMG)—A New Scaling Concept for Very High–Density EPROM's," IEEE Electron Device Letters, pp. 450–452, vol. 12, No. 8, Aug. 1991, IEEE.

Boaz Eitan et al.: "NROM: A Novel Localized Trapping, 2–Bit Nonvolatile Memory Cell," IEEE Electron Device Letters, pp. 543–545, vol. 21, No. 11, Nov. 2000, IEEE.

Boaz Eitan et al.: "Multilevel Flash cells and their Trade–offs," IEEE Electron Device Letters, pp. 169–172, 1996, IEEE.

Dr. Heinrich Endert: "Excimer Lasers as Tools for Material Processing in Manufacturing," Technical Digest: International Electron Devices Meeting, 1985, pp. 28–29, Washington, DC, Dec. 1–4, 1985, Göttingen, Germany.

Dov Frohman–Bentchkowsky: "A Fully Decoded 2048–Bit Electrically Programmable FAMOS Read–Only Memory," IEEE Journal of Solid–State Circuits, pp. 301–306, vol. sc–6, No. 5, Oct. 1971.

G.K. Giust et al.: "Laser–Processed Thin–Film Transistors Fabricated from Sputtered Amorphous–Silicon Films," IEEE Transactions on Electron Devices, pp. 207–213, vol. 47, No. 1, Jan. 2000, IEEE.

G.K. Giust et al.: "High–Performance Thin–Film Transistors Fabricated Using Excimer Laser Processing and Grain Engineering," IEEE Transactions on Electron Devices, pp. 925–932, vol. 45, No. 4, Apr. 1998, IEEE.

G.K. Giust et al.: "High–Performance Laser–Processed Polysilicon Thin–Film Transistors," IEE Electron Device Letters, pp. 77–79, vol. 20, No. 2, Feb. 1999, IEEE.

C. Hayzelden et al.: "Silicide Formation and Silicide–Mediated Crystallization of Nickel–Implanted Amorphous Silicon Thin Films," J. Appl. Phys. 73(12), Jun. 15, 1993, pp. 8279–8289, 1993 American Institute of Physics.

Fumihiko Hayashi et al.: "A Self–Aligned Split–Gate Flash EEPROM Cell with 3–D Pillar Structure," 1999 Symposium on VLSI Technology Digest of Technical Papers, pp. 87–88, Stanford University, Stanford, CA 94305, USA.

Stephen C.H. Ho et al.: "Thermal Stability of Nickel Silicides in Different Silicon Substrates," Department of Electrical and Electronic Engineering, pp. 105–108, 1998, IEEE.

Sung–Hoi Hur et al.: "A Poly–Si Thin–Film Transistor EEPROM Cell with a Folded Floating Gate," IEEE Transactions on Electron Devices, pp. 436–438, vol. 46, No. 2, Feb. 1999, IEEE.

J. Esquivel et al. "High Density Contactless, Self Aligned EPROM Cell Array Technology," Texas Instruments (Dallas), IEDM 86, pp. 592–595, 1986, IEEE.

R. Kazerounian et al.: Alternate Metal Virtual Ground EPROM Array Implemented in a 0.8 μm Process for Very High Density Applications, IEDM 91, pp. 311–314, 1991, IEEE.

Chang–Dong Kim et al.: "Short–Channel Amorphous–Silicon Thin–Film Transistors," IEEE Transactions on Electron Devices, pp. 2172–2176, vol. 43, No. 12, Dec. 1996, IEEE.

Johan H. Klootwijk et al.: "Deposited Inter–Polysilicon Dielectrics for Nonvolatle Memories," IEEE Transactions on Electron Devices , pp. 1435–1445, vol. 46, No. 7, Jul. 1999, IEEE.

NEC Corporation: "A Novel Cell Structure for Giga–bit EPROMs and Flash Memories Using Polysilicon Thin Film Transistors," 1992 Symposium on VLSI Technology Digest of Technical Papers, pp. 44–45, 1992, IEEE.

Ja–Hum Ku et al.: "High Performance pMOSFETs With Ni(Si/sub x/Ge/sub 1–x Si/Sub 0.8/Ge/sub 0.2/ gate, IEEE Xplore Citation," VLSI Technology, 200. Digest of Technical Paper Symposium on page(s): 114–115 Jun. 13–15, 2000.

Nae–In Lee et al.: "High–Performance EEPROM's Using N– and P–Channel Polysilicon Thin–Film Transistors with Electron Cyclotron Resonance N2O–Plasma Oxide," pp. 15–17, IEEE Electron Device Letters, vol. 20, No. 1, Jan. 1999, IEEE.

Jin–Woo Lee et al.: "Improved Stability of Polysilicon Thin–Film Transistors under Self–Heating and High Endurance EEPROM Cells for Systems–On–Panel," IEEE Electron Device Letters, 1998, pp. 265–268, IEEE.

Seok–Woon Lee et al.: "Pd induced lateral crystallization of Amorphous Si Thin Films," Appl. Phys. Lett. 66 (13), pp. 1671–1673, Mar. 27, 1995, American Institute of Physics.

K. Miyashita etal.: "Optimized Halo Structure for 80 nm Physical Gate CMOS Technology with Indium and Antimony Highly Angled Ion Implantation," IEDM 99–645, pp. 27.2.1–27.22.4, 1999, IEEE.

N.D. Young et al.: "The Fabrication and Characterization of EEPROM Arrays on Glass Using a Low–Temperature Poly–Si TFT Process," IEEE Transactions on Electron Devices, pp. 1930–1936, vol. 43, No. 11, Nov. 1996, IEEE.

Jung–Hoon Oh et al.: "A High–Endurance Low–Temperature Polysilicon Thin–Film Transistor EEPROM Cell," pp. 304–306, IEEE Electron Device Letters, vol. 21, No. 6, Jun. 2000, IEEE.

Webpage—M.C. Poon. et al.: "Thermal Stability of Cobalt and Nickel Silicides in Amorpho Crystalline Silicon," p. 1, IEEE Xplore, Electron Devices Meeting, 1997, Proceedings, 19 Hong Kong, 2000, IEEE.

Noriaki Sato et al.: "A New Programmable Cell Utilizing Insulator Breakdown," IEDM, 1985 pp. 639–642, IEEE.

Takeo Shiba et al.: "In Situ Phosphorus–Doped Polysilicon Emitter Technology for Very High–Speed, Small Emitter Bipolar Transistors," IEEE Transactions on Electron Devices, pp. 889–897, vol. 43, No. 6, Jun. 1996, IEEE.

Seungheon Song et al.: "High Performance Transistors with State–of–the–Art CMOS Technologies," IEDM 99, pp. 427–430, 1999, IEEE.

Vivek Subramanian et al.: "Low–Leakage Germanium-Seeded Laterally–Crystallized Single–Grain 100–nm TFT's for Vertical Integration Applications," IEEE Electron Device Letters, pp. 341–343, vol. 20, No. 7, Jul. 1999, IEEE.

Yoshihiro Takao et al. "Low–Power and High–Stability SRAM Technology Using a Laser–Recrystallized p–Channel SOI MOSFET," IEEE Transactions on Electron Devices, pp. 2147–2152, vol. 39, No. 9, Sep. 1992, IEEE.

Kenji Taniguchi et al.: "Process Modeling and Simulation: Boundary Conditions for Point Defect–Based Impurity Diffusion Model," IEEE Transactions on Computer–Aided Design , pp. 1177–1183, vol. 9, No. 11, Nov. 1990, IEEE.

Hongmei Wang et al.: "Submicron Super TFTs for 3–D VLSI Applications," IEEE Electron Device Letters, pp. 391–393, vol. 21, No. 9, Sep. 2000, IEEE.

Hongmei Wang et al.: "Submicron Super TFTs for 3–D VLSI Applications," IEEE Electron Device Letters, vol. 21, No. 9, pp. 439–441, Sep. 2000, IEEE.

Hongmei Wang et al.: "Super Thin–Film Transistor for SOI CMOS Performance Formed by a Novel Grain Enhancement Method," IEEE Transactions on Electron Devices, pp. 1580–1586, vol. 47, No. 8, Aug. 2000, IEEE.

Marvin H. White et al. "On the Go With Sonos," Circuit & Devices, pp. 22–31, Jul. 2000, IEEE.

B.J. Woo et al.: "A Novel Memory Cell Using Flash Array Contactless Eprom (Face) Technology," IEDM, pp. 90–93, 1990, IEEE.

Webpage—Qi Xiang et al.: "Deep sub–100 nm CMOS with Ultra Low Gate Sheet Resista NiSi," VLSI Technology, 2000. Digest of Technical Paper Symposium on . . . pp. 76–77, IEEE Xplore, Jun. 13–15, 2000.

Qi Xiang et al. "Deep Sub–100nm CMOS with Ultra Low Gate Sheet Resistance by NiSi," IEEE, pp. 76–77, 2000, Symposium on VLSI Technology Digest of Technical Papers.

Qiuxia Xu et al.: "New Ti–SALICIDE Process Using Sb and Ge Preamorphization for Sub–0.2 $\mu$m CMOS Technology," IEEE Transactions on Electron Devices, pp. 2002–2009, vol. 45, No. 9, Sep. 1998, IEEE.

Kuniyoshi Yoshikawa et al.: "An Asymmetrical Lightly Doped Source Cell for Virtual Ground High–Density EPROM's," IEEE Transactions on Electron Devices, pp. 1046–1051, vol. 37, No. 4, Apr. 1990, IEEE.

Vivek Subramanian: "Control of Nucleation and Grain Growth in Solid–Phase Crystallized Silicon for High–Performance Thin Film Transistors," A Dissertation Submitted to the Department of Electrical Engineering and the Committee of Graduate Studies of Stanford University in Partial Fulfillment of the Requirements for the Degree of Doctor of Philosphy, Jun. 1998.

Brian Dipert: "Exotic Memories, Diverse Approaches," EDN Asia, Sep. 2001.

John R. Lindsey et al.: "Polysilicon Thin Film Transistor and EEPROM Characteristics for Three Dimensional Memory," The 198$^{th}$ Meeting of The Electrochemical Society, Volum 2000–2.

Dietmar Gogl et al.: "A 1–Kbit EEPROM in SIMOX Technology for High–Temperature Applications up to 250° C.," IEEE Journal of Solid–State Circuits, Oct. 2000, vol. 35, No. 10, IEEE.

Stanley Wolf: "Silicon Processing for the VLSI Era," Semiconductor Memory Process Integration, vol. 2.

* cited by examiner

TFT MASK ROM AND METHOD FOR MAKING SAME

This application is a continuation-in-part of U.S. application Ser. No. 09/927,648, filed on Aug. 13, 2001, and is a continuation-in-part of U.S. application Ser. No. 09/961,278 filed on Sep. 25, 2001, now U.S. Pat. No. 6,593,624 both of which are incorporated herein by reference.

FIELD OF THE INVENTION

The present invention is directed generally to semiconductor devices and methods of fabrication and more particularly to a thin film transistor (TFT) mask ROM and method of fabrication.

BACKGROUND OF THE INVENTION

Thin film transistors (TFTs) are utilized in various devices, such as a liquid crystal displays, static random access memories and in nonvolatile memories. U.S. Pat. Nos. 5,572,046 and 5,383,149 also suggest using TFTs in a mask read only memory (mask ROM or MROM). Conventional TFTs have a structure that is similar to conventional bulk metal oxide semiconductor field effect transistors (MOSFETs), except that TFTs are formed in a semiconductor layer that is located above an insulating substrate, such as a glass substrate, or above a semiconductor substrate that is covered by an insulating layer.

The mask ROM derives its name from the fact that this nonvolatile memory is programmed or written using a custom mask during fabrication. In a conventional mask ROM fabrication process, a semi-finished array of transistors is covered by a photoresist layer. This photoresist layer is patterned using the custom photolithography mask to expose the channel regions of a first set of transistors while covering the channel regions of a second set of transistors of the array. The exposed channel regions are then rendered non-conductive by implanting the exposed channel regions of a first conductivity type with ions of the same conductivity type in order to raise the threshold voltage of the implanted transistors. Thus, the mask ROM array contains a first set of enabled transistors and a second set of disabled transistors.

Each bit of information in a mask ROM is stored by the presence or absence of a data path from a word (access) line to a bit (sense) line. The data path is eliminated by ensuring that no operational circuit element (i.e., transistor) joins a word and a bit line, such as by increasing the threshold voltage of selected transistors by the selective ion implantation. When a word line of a mask ROM is activated, the presence of a signal on the bit line will mean that a "1" is stored, whereas the absence of a signal will indicate that the bit location is storing a "0", as discussed on pages 619–621 of S. Wolf, Silicon Processing for the VLSI Era, Vol. 2, Lattice Press, 1990, incorporated herein by reference. Mask ROM arrays may be implemented as NOR or NAND arrays, for example.

The state of the art mask ROM has an effective cell area of $4F^2$, where F is the minimum feature size. This cell area is larger than desirable, and leads to a less than optimum cell density, which increases the cost of the mask ROM.

BRIEF SUMMARY OF THE INVENTION

A preferred embodiment of the present invention provides a monolithic three dimensional TFT mask ROM array, comprising a plurality of device levels, wherein each device level comprises a first set of enabled TFTs and a second set of partially or totally disabled TFTs.

Another preferred embodiment of the present invention provides a TFT mask ROM array, comprising (a) a first plurality of spaced apart conductor rails disposed at a first height above a substrate in a first direction and (b) a second plurality of spaced apart rail stacks disposed at a second height in a second direction different from the first direction. Each rail stack includes (i) a first semiconductor layer whose first surface is in contact with said first plurality of spaced apart conductor rails, (ii) a conductive film, and (iii) a gate insulating film disposed between a second surface of the first semiconductor layer and the conductive film. The TFTs are formed at intersections of two adjacent first rails and the second rail stack. The TFTs comprise a first set of enabled TFTs and a second set of partially or totally disabled TFTs.

Another preferred embodiment of the present invention provides a mask ROM array, comprising a first set of enabled transistors containing a charge storage region, and a second set of partially or totally disabled transistors.

Another preferred embodiment of the present invention provides a method of making monolithic three dimensional TFT mask ROM array, comprising forming a first device level comprising a plurality of TFTs over a substrate, forming a first mask over the first device level, and partially or totally disabling a first set of TFTs in the first device level. The method also comprises forming a second device level comprising a plurality of TFTs over the first device level, forming a second mask over the second device level, and partially or totally disabling a second set of TFTs in the second device level.

Another preferred embodiment of the present invention provides a method of making a TFT mask ROM array, comprising forming a first plurality of spaced apart conductor rails disposed at a first height above a substrate in a first direction, forming a first semiconductor layer whose first surface is in contact with said first plurality of spaced apart conductors and forming a first mask over the first semiconductor layer. The method also comprises selectively etching unmasked portions of the first semiconductor layer or selectively implanting ions into unmasked portions of the first semiconductor layer, forming a conductive film, and forming a gate insulating film disposed between a second surface of the first semiconductor layer and the conductive film. The method also comprises forming a second mask, and patterning the first semiconductor layer, the gate insulating film and the conductive film to form a second plurality of spaced apart rail stacks disposed at a second height in a second direction different from the first direction.

Another preferred embodiment of the present invention provides a method of making a mask ROM array, comprising forming an array of transistors containing a charge storage region, forming a mask over the array, and selectively totally or partially disabling unmasked transistors.

DETAILED DESCRIPTION OF THE PREFERRED EMBODIMENTS

In a preferred embodiment of the present invention, mask ROM density is increased and its cost is decreased by forming a the mask ROM as a monolithic three dimensional array of TFTs. By integrating the array in three dimensions, the effective cell area of the array is reduced to $4F^2/N$, where F is the minimum feature size and N is the number of device levels in the array.

Figure 1:
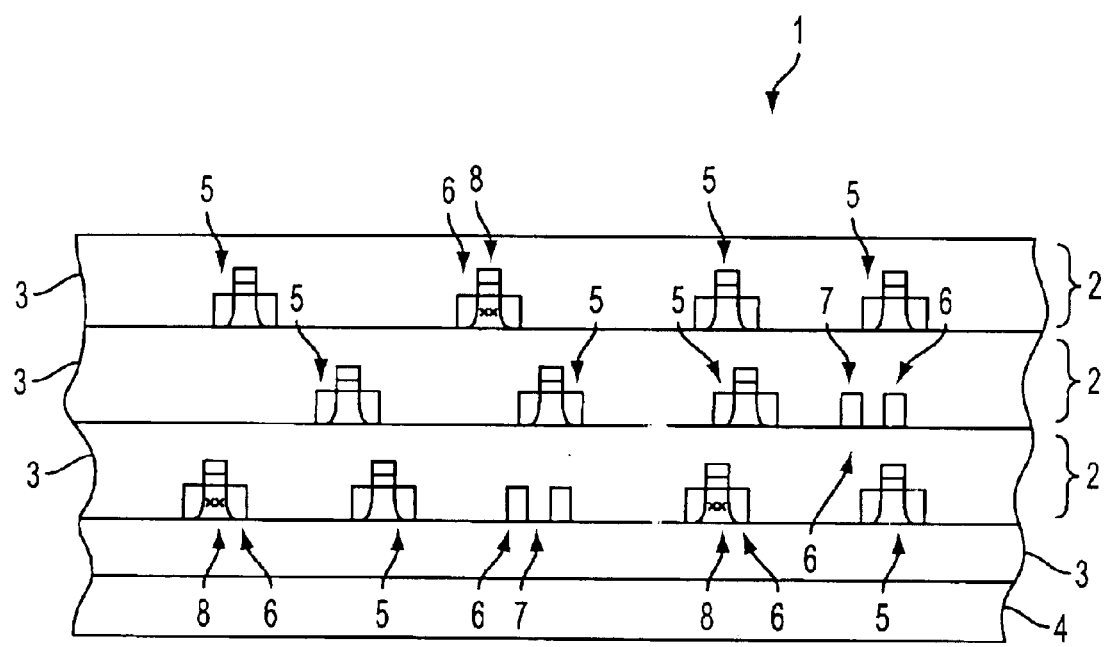
FIGS. 1, 3 and 5A and 5B are side cross sectional views of arrays according to the preferred embodiments of the present invention.

FIG. 1 illustrates a monolithic three dimensional TFT mask ROM array 1 according to a preferred embodiment of the present invention. The array comprises a plurality of device levels 2 separated by interlevel insulating layers 3. There may be two or more device levels, such as four to eight device levels 2, separated by one or more interlevel insulating layers 3, such as three to seven insulating layers 3. The device levels 2 alternate with interlevel insulating layers 3. The array 1 is preferably formed over a substrate 4.

Each device level 2 contains a first set of enabled TFTs 5 and a second set of partially or totally disabled TFTs 6. In one preferred aspect of the invention, the term "totally disabled" means that a particular TFT is rendered permanently off for any input voltage. In another preferred aspect of the invention, the term "partially disabled" means either that a threshold voltage of a particular TFT has been increased such that this TFT is in the off state for a particular value of input voltage that would be sufficient to turn an enabled TFT on and/or that a sense current of this TFT is lower than that of an enabled TFT. However, a partially disabled TFT may be turned on by providing an input voltage higher than the input voltage sufficient to turn the enabled TFT on.

In one preferred aspect of the invention, the second set of TFTs 6 comprises only totally disabled TFTs. In another preferred aspect of the invention, the second set of TFTs 6 contains both totally and partially disabled TFTs. Thus, a so-called "multilevel" mask ROM array 1 is formed if the array contains partially disabled TFTs. An example of a conventional multilevel mask ROM is provided in U.S. Pat. No. 5,668,029, incorporated herein by reference. In a multilevel mask ROM, multiple levels of conduction current may be sensed when the ROM array is accessed, since a different amount of conduction current is sensed from bit lines of the enabled and the partially disabled TFTs. Of course, the second set of TFTs 6 may only contain partially disabled TFTs if desired.

It should be noted the array 1 may contain optional additional device levels (not shown in FIG. 1) which contain only enabled TFTs 5 or only disabled TFTs 6. Furthermore, the optional additional device levels may contain devices other than TFTs and be used for circuits other than the mask ROM. For example, peripheral or driver circuits may be formed in the substrate 4 or in one or more array 1 device levels 2.

A TFT may be disabled by any means that prevents or restricts a flow of data (i.e, current) between the word line and the bit line contacting the TFT. For example, the TFTs of the second set 6 may be disabled by removing at least a portion of channel regions of these TFTs using a mask, such as a photoresist mask, to render these TFTs totally inoperative. Alternatively, the TFTs of the second set 6 may be disabled by selectively doping channel regions of these TFTs using a mask to increase the threshold voltage of these TFTs above a predetermined amount to render said TFTs partially or totally inoperative. Furthermore, the TFTs of the second set 6 may be totally disabled by removing (i.e., etching) unmasked contacts between a word line or a bit line and the TFTs. For example, a gate electrode, source or drain electrodes and/or source or drain regions may be removed to disable the TFT.

For example, in one preferred embodiment of the present invention, at least a portion of channel regions of a first subset 7 of the TFTs of the second set 6 have been selectively removed to render the first subset 7 of the TFTs totally disabled, as shown in FIG. 1. The channel regions of a second subset 8 of the TFTs of the second set 6 have been selectively doped to increase a threshold voltage of said TFTs to render said TFTs partially disabled to form a multilevel mask ROM, as shown in FIG. 1. The first 7 and the second 8 subsets are disabled using different masks.

In an alternative embodiment of the present invention, the first subset of TFTs 7 may be rendered totally disabled by a first threshold voltage adjustment implant, while the second subset of TFTs 8 may be rendered partially disabled by a lower concentration threshold voltage adjustment implant. Preferably, the first and the second implants are carried out at the same time through the same photoresist mask using the same dose of implanted ions. The photoresist mask fully covers the channel regions of the enabled TFTs, partially covers the channel regions of the partially disabled TFTs, and does not cover the channel regions of the fully disabled TFTs. The difference in mask coverage results in a different concentration of ions being implanted into the TFT channel regions.

The TFTs 5 and 6 may comprise any type of metal oxide semiconductor (MOS) TFTs, such as top gate co-planar TFTs, top gate staggered TFTs, bottom gate co-planar TFTs and/or bottom gate staggered TFTs. In co-planar TFTs, the source/drain electrodes and the gate electrode are on the same side of the channel. In staggered TFTs, the source/drain electrodes and the gate electrode are on the opposite sides of the channel. The array 1 may comprise one type of TFTs or more than one type of TFTs. Furthermore, TFTs may comprise bipolar TFTs, if desired.

Figure 2:
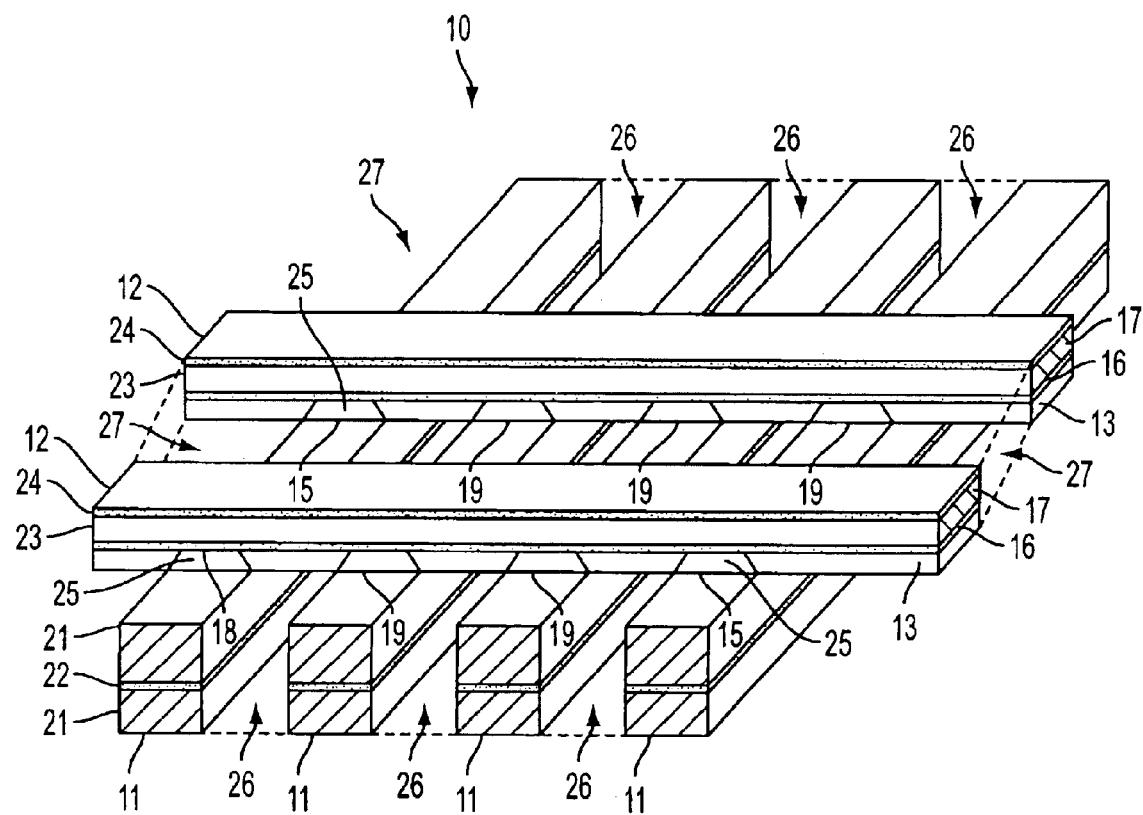
FIG. 2 is a three dimensional view of an array according to a preferred embodiment of the present invention.

In one preferred embodiment of the present invention, the mask ROM array is provided in a "rail stack" staggered TFT configuration. FIG. 2 illustrates one preferred configuration of an array 10 of top gate staggered rail stack TFTs. The array 10 includes a first plurality of spaced apart conductor rails 11 disposed at a first height above a substrate (not shown for clarity) in a first direction. The array also includes a second plurality of spaced apart rail stacks 12 disposed at a second height in a second direction different from the first direction. Each rail stack includes a first semiconductor layer 13 whose first surface 15 is in contact with the first plurality of spaced apart conductor rails 11. Each rail stack 12 also includes a conductive film 17 and a gate insulating film 16 disposed between a second surface 18 of the first semiconductor layer 13 and the conductive film 17. Each TFT cell 19 is formed at the intersection of two adjacent first rails 11 and one second rail stack 12. The TFT 19 channel length is determined by the space between the adjacent rails 11, and its channel width is determined by the width of the second rail stack 12. The TFTs 19 comprise a first set of enabled TFTs and a second set of partially or totally disabled TFTs, as described with respect to FIG. 1.

The first plurality of rails 11 preferably comprise heavily doped polysilicon layers 21 of a first conductivity type (i.e., N+ or P+) in contact with metal or a metal silicide layers 22. The metal or metal silicide layers 22 are preferably formed buried within the rails 11, but may also be formed on the sides and/or bottom of the rails 11. The metal may comprise aluminum, copper, tungsten or titanium (including titanium nitride). The metal silicide may comprise any silicide, such as titanium, tungsten, cobalt, platinum or nickel silicide.

The first semiconductor layer 13 preferably comprises a polysilicon layer of a second conductivity type (i.e., P− or N−). However, an amorphous silicon layer may be used instead. The substrate may be a silicon or other semiconductor substrate with an overlying interlevel insulating layer. Alternatively, the substrate may comprise an insulating material, such as glass, quartz, ceramic or plastic. The conductive film 17 preferably comprises a polysilicon layer 23 and a metal silicide layer 24. As used herein, a "film" may contain one or more "layers".

The gate insulating film 16 may comprise a silicon oxide or a silicon nitride layer or any other one or more insulating layers. In one preferred embodiment, film 16 comprises a portion of a charge storage region. Preferably, film 16 comprises a portion of a charge storage region, when it is desired to form a mask ROM and an EEPROM (electrically erasable programmable ROM) together in the same array of transistors, as will be described in more detail below with respect to FIGS. 6–9. The charge storage region may comprises a dielectric isolated floating gate (i.e., a polysilicon floating gate located between a tunnel dielectric and a control gate dielectric), an ONO dielectric film (i.e., a stack of silicon oxide/silicon nitride or oxynitride silicon oxide layers) or an insulating layer containing conductive nanocrystals. The ONO dielectric film comprises a tunnel oxide, a charge storage $Si_3N_{4-x}O_{1.5x}$ layer, where x is 0 to 1, and a blocking oxide. The tunnel oxide has a thickness of 1.5 nm to 7 nm, preferably 2.5 nm. The charge storage silicon nitride or silicon oxynitride ($Si_3N_{4-x}O_{1.5x}$) layer has a thickness of at least 4 nm, preferably 4–15 nm, most preferably 5 nm. The blocking oxide layer has a thickness of 3 nm to 9 nm, preferably 4.0 nm. The insulating layer containing the conductive nanocrystals may comprise silicon, tungsten or aluminum nanocrystals dispersed in a silicon oxide, nitride or oxynitride insulating layer.

The polysilicon layers 21 of the first rails 11 comprise at least a portion of the TFT 19 source and drain regions. The conductive film 17 comprises a gate of the TFTs. Portions of the first semiconductor layer 13 comprise TFT channel regions of a second conductivity type. If desired, optional doped regions 25 of a first conductivity type may be outdiffused from layers 21 into the first semiconductor layer 13. Thus, optional regions 25 and layers 21 comprise the TFT 19 source and drain regions, while the metal or metal silicide layers 22 comprise the source and drain electrodes. Alternatively, regions 25 may be omitted and layers 21 may comprise the entire source and drain regions of the TFTs 19. Furthermore, if desired, intrinsic or lightly doped polysilicon layers of the first conductivity type may be formed in the first rails 11 between the heavily doped layers 21 and the first semiconductor layer 13 to form offset or low doped drain (LDD) layers.

Preferably, a first planarized insulating layer 26, such as silicon oxide, is located between the first rails 11, and a second planarized insulating layer 27, such as silicon oxide, is located between the second rail stacks 12 (layers 26 and 27 are shown by dashed lines in FIG. 2 for clarity). Alternatively, one or more of silicon oxynitride, silicon nitride, spin-on glass, BPSG, PSG or BSG may be used instead of or in addition to silicon oxide. Layers 26 and 27 may be planarized by chemical mechanical polishing or by other planarization methods.

Figure 3:
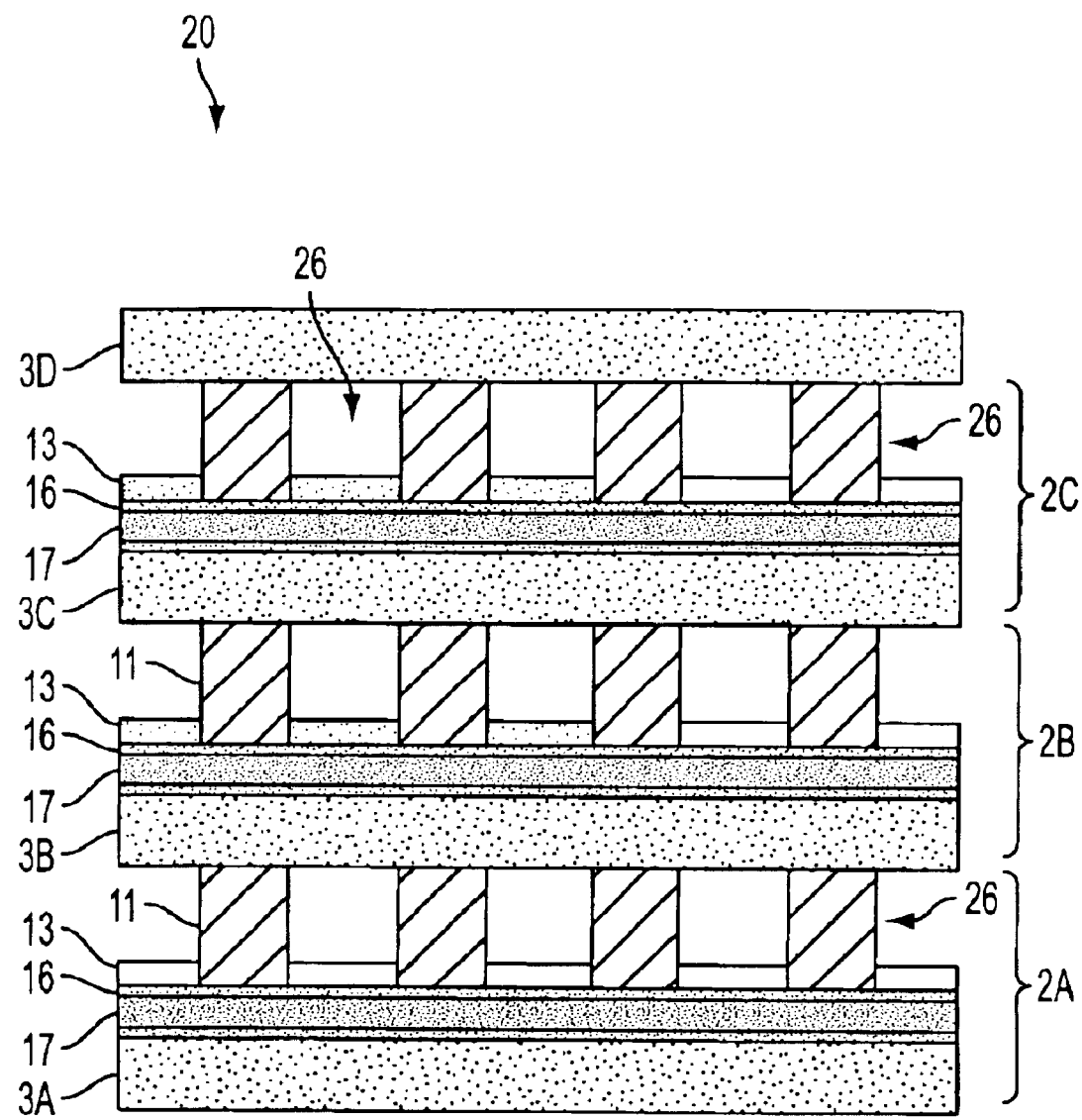

In FIG. 2, the first rails 11 are located below the second rail stacks 12 to form an array 10 of top gate staggered TFTs (i.e., the gate 17 is formed above the channel 13 on the opposite side of the source and drain regions 21). Alternatively, the first rails 11 may be located above the second rail stacks 12 (i.e., layers 13, 16 and 17) to form an array 20 of bottom gate staggered TFTs, as shown in FIG. 3. If desired, the arrays 10 or 20 may be formed in a monolithic three dimensional array. In this case, the array comprises a plurality of device levels 2A–2C, each containing an array 10 or 20, separated by interlevel insulating layers 3A–3D, similar to the array shown in FIG. 1. However, since the rail stack arrays 10 or 20 have a high density, these arrays may comprise only one device level, if desired.

Figure 4A:
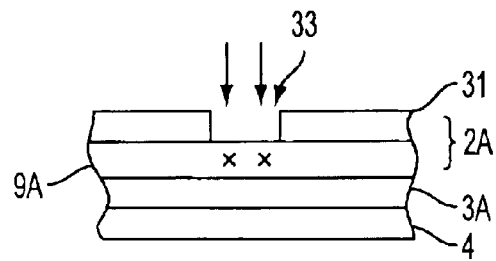
FIGS. 4A–D are side cross sectional view of a preferred method of making the array of FIG. 1.

The mask ROM arrays of the preferred embodiments described above may be made by any method. A preferred method of making a monolithic three dimensional TFT mask ROM array includes the following steps shown in FIGS. 4A–D. A first device level 2A comprising a plurality of TFT channel regions is provided over a substrate 4. The first device level 2A contains a semiconductor layer 9A that will used to form TFT channel regions. Preferably, layer 9A is formed over an insulating layer 3A, which is formed over the substrate 4, as shown in FIG. 4A.

A first mask 31, such as a photoresist mask, is formed over the semiconductor layer 9A. Mask 31 covers all of layer 9A where the channel regions of the first set of TFTs 5 will be formed, except region(s) 33, where the channel regions of the second set of TFTs 6 will be formed, as shown in FIG. 4A. A second set of TFTs 6 in the first device level 2A is then totally or partially disabled by selective etching or ion implanting the unmasked channel regions 33 of the second set of TFTs 6. For example, selective ion implanting is schematically shown in FIG. 4A by arrows and the "xx" symbol.

Figure 4B:
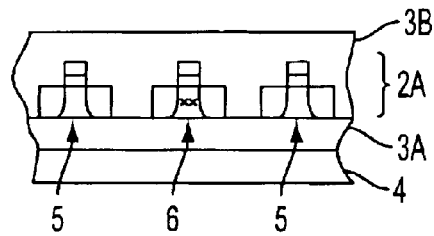

The TFTs 5 and 6 of the array are then completed by forming a gate insulating layer on the channels, gate electrodes on the gate insulating layer, source and drain regions, and any other required layers for a functional TFT, as shown in FIG. 4B. Alternatively, the step of forming a mask 31 and the step of disabling the TFTs 6 by etching or ion implantation may be carried out after the first and the second sets of TFTs 5 and 6 have been completed. Thus, the ion implantation may be carried out through the gate electrode into the channel. Likewise, the selective etching may be used to remove the gate electrode in addition to or instead of removing the channel.

A first interlevel insulating layer 3B is then formed over the first device level 2A, as shown in FIG. 4B. Layer 3B may comprise one or more of silicon oxide, silicon oxynitride, silicon nitride, spin-on glass, BPSG, PSG, BSG or any other insulating layers. The first interlevel insulating layer 3B is preferably planarized by chemical mechanical polishing or etchback.

Figure 4C:
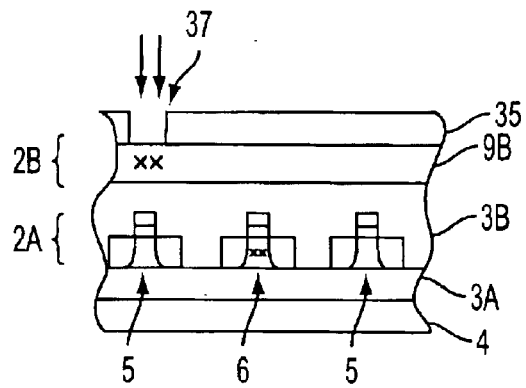

A second device level 2B comprising a plurality of TFT channel regions is formed over the first interlevel insulating layer 3B, as shown in FIG. 4C. The second device level 2B contains a semiconductor layer 9B that will used to form TFT channel regions. A second mask 35, such as a photoresist mask, is formed over the semiconductor layer 9B, such that it covers all of layer 9B where the channel regions of the first set of TFTs 5 will be formed, except region(s) 37, where the channel regions of the second set of TFTs 6 will be formed, as shown in FIG. 4C.

Figure 4D:
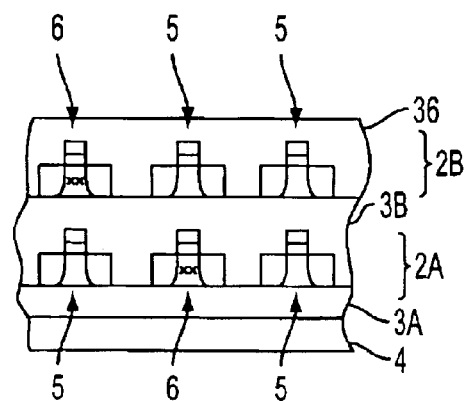

A second set of TFTs 6 in the second device level 2B are then totally or partially disabled by selective etching or ion implanting the unmasked channel regions 37 of the second set of TFTs 6. The TFTs 5 and 6 of the array are then completed by forming a gate insulating layer on the channels, gate electrodes on the gate insulating layer, source and drain regions, and any other required layers for a functional TFT, as shown in FIG. 4D. If desired, a second interlevel insulating layer 3C is formed over the second device level 2B.

Thus, a three dimensional monolithic array is formed. Of course, the array may contain more than two device layers 2A, 2B, such as four to eight device layers. To form additional device layers, a plurality of interlevel insulating layers are formed. A plurality of device levels comprising a plurality of TFTs are formed over the plurality of interlevel insulating layers (i.e., each interlevel insulating layer is formed between adjacent device layers). A mask is formed over each of the plurality of device levels, and a second set of TFTs in the plurality of device levels is partially or totally disabled.

The term "monolithic", as used above, means that layers of each level of the array were directly deposited on the layers of each underlying level of the array. Thus, a first array of transistors is formed in a first semiconductor layer. Then, an interlayer insulating layer is formed over the first array of transistors. A second semiconductor layer is formed over the second interlayer insulating layer. A second array of transistors is formed in the second semiconductor layer to form a monolithic three dimensional array. Additional array levels may be formed in the same fashion if desired. In contrast, two dimensional arrays may be formed separately and then packaged together to form a nonmonolithic memory device.

A similar method may be used to form an array of rail stack TFTs shown in FIG. 2 or 3. To form the array 10 of top gated TFTs shown in FIG. 2, a first plurality of spaced apart conductor rails 11 are formed at a first height above a substrate in a first direction. Then, a first semiconductor layer 13 is formed such that its first surface 15 is in contact with said first plurality of spaced apart conductors 11.

A first mask 31 is formed over the first semiconductor layer 13, similar to that shown in FIG. 4A. The unmasked portions of layer 13 are selectively etched or ion implanted, similar to that shown in FIG. 4A. Thereafter, the gate insulating film 16 and conductive film 17 are formed over the etched or implanted first semiconductor layer 13. Then, a second photoresist mask (not shown) is formed over the conductive film 17. The first semiconductor layer 13, the gate insulating film 16 and the conductive film 17 are then patterned (i.e., etched) using the second mask to form a second plurality of spaced apart rail stacks 12. The rail stacks are disposed at a second height in a second direction different from the first direction, as shown in FIG. 2.

To form the array 20 of bottom gated TFTs of FIG. 3, the order of steps is reversed. The conductive film 17 and the gate insulating film 16 and the first semiconductor film 13 are formed in this order. Then, the first mask 31 is formed over layer 13 and the selective etching or ion implantation of layer 13 is performed. Then, the films 17 and 16 and layer 13 are patterned to form the second rail stacks 12. If desired, the rail stacks 12 may be formed before forming the first mask 31 on layer 13. Then, the first rails 11 are formed on the second rail stacks 12, as shown in FIG. 3. If desired, the arrays 10 and 20 may be included in a monolithic three dimensional array by forming an interlevel insulating layer over each array and forming another array 10 or 20 over the interlayer insulating layer, as many times as desired.

Figure 5A:
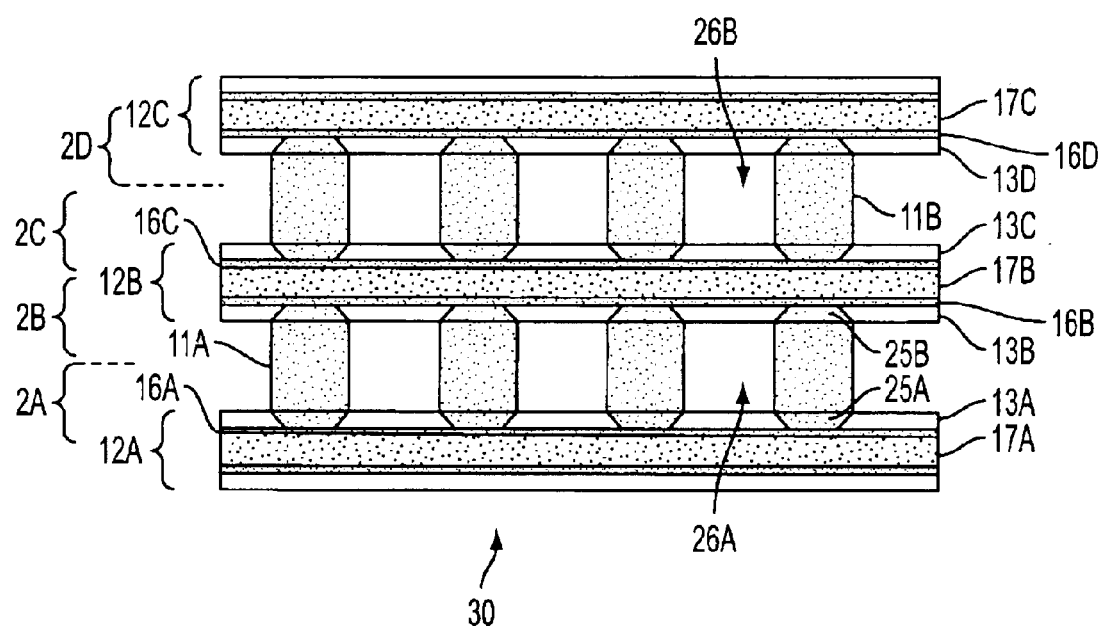

FIGS. 1, 2 and 4A–D illustrate a monolithic three dimensional array where adjacent device levels are separated by an interlevel insulating layer. However, in another preferred embodiment of the present invention, some or all interlevel insulating layers are omitted and at least two adjacent device levels in a monolithic three dimensional array contact each other, as shown in FIG. 5A. The exemplary array 30 illustrated in FIG. 5A contains four device levels 2A–2D. Of course, there may be more or less than four device levels. The array 30 is similar to arrays 10 or 20, except that layers of the array 30 are copied in a mirror image fashion in the vertical direction. The layers in FIG. 5A are numbered in the same fashion as in FIGS. 2 and 3, except that the layers have a suffix, such as "A" through "D", depending on which device level 2A–D contains the particular device layer.

In the layout of FIG. 5A, rails 11 A are shared between adjacent device levels 2A and 2B, while rails 11 B are shared between adjacent device levels 2C and 2D. Likewise, the conductive layer (i.e., gate electrode) 17B of rail stack 12B is shared between adjacent device levels 2B and 2C. Thus, adjacent device level pairs 2A/2B, 2B/2C and 2C/2D contact each other. However, each device level 2A–D contains its own channel layer 13A–D and its own gate insulating layer 16A–D, which are not shared with adjacent device levels. Thus, each rail stack that is shared between device levels contains a conductive layer 17 between two gate insulating layers 16 and two channel layers 13. Device levels 2A and 2C contain bottom gated TFTs, while device levels 2B and 2D contain top gated TFTs. The array 30 may contain n-type or p-type TFTs, as desired. The TFTs of array 30 comprise a first set of enabled TFTs and a second set of partially or totally disabled TFTs, as described with respect to FIG. 1.

Figure 5B:
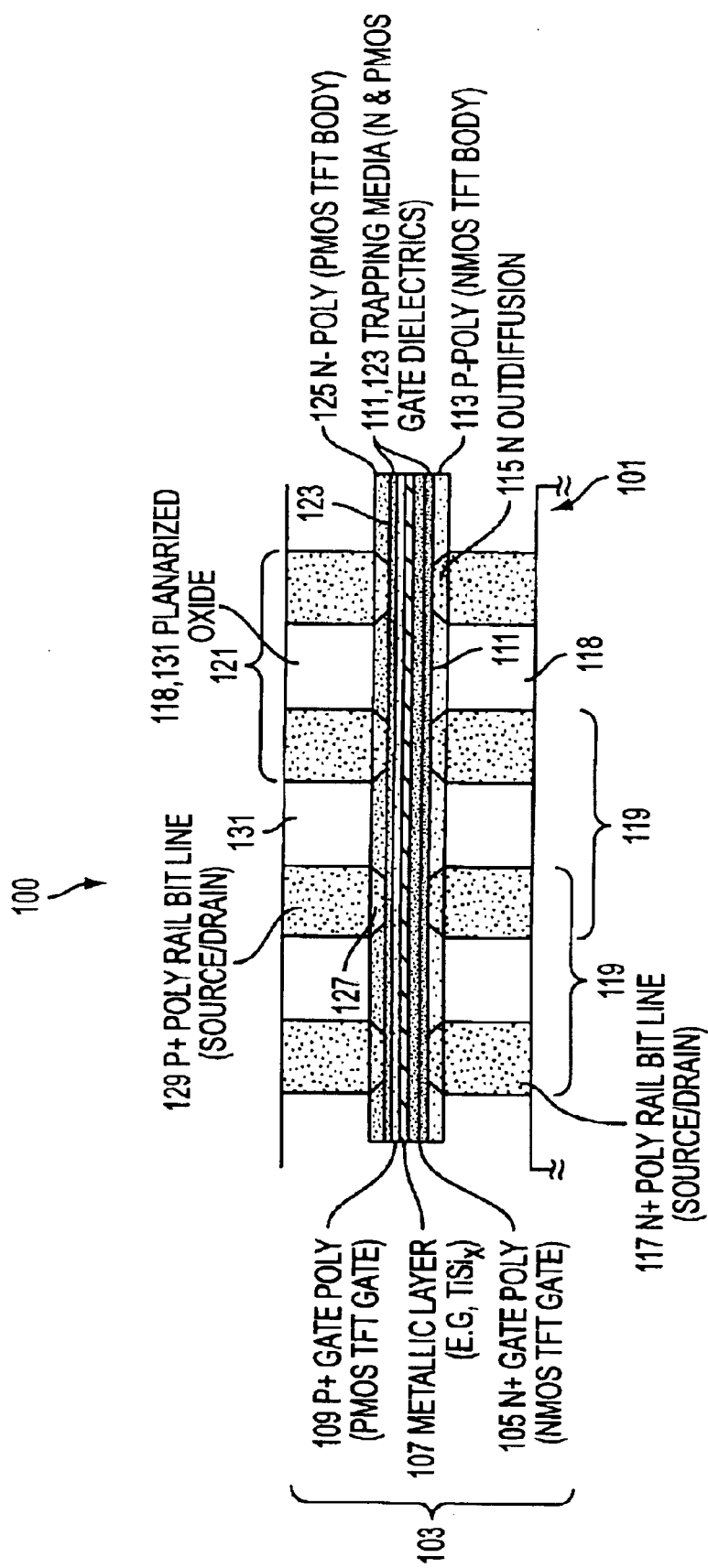

FIGS. 2, 3 and 5A illustrate an array of n-type TFTs (i.e., NMOS) or p-type TFTs (i.e., PMOS) according to the preferred embodiments of the invention. FIG. 5B illustrates one device level of a vertically stacked, common gate CMOS mask ROM array in a rail stack configuration according to another preferred embodiment of the present invention. The CMOS array in FIG. 5B is similar to the arrays illustrated in FIG. 2, 3 or 5A except that transistors of different charge carrier type are formed on either side of the gate line. In FIG. 5B, the NMOS transistors are arranged below the PMOS transistors. However, it should be understood that the PMOS transistors may be arranged below the NMOS transistors if desired.

In FIG. 5B, the array of CMOS devices 100 is preferably formed over a planarized interlayer insulating layer 101, such as a CMP planarized silicon oxide layer. Layer 101 is formed over a substrate (not shown) as in the previous embodiments. Each CMOS device is thus a CMOS TFT because it is formed over an insulating layer. However, the CMOS devices may be formed in a monocrystalline silicon substrate, if desired.

The array includes a plurality of gate lines (i.e., word lines) 103 (only one gate line is shown in the cross sectional view of FIG. 5B). Preferably the gate line comprises a first N+ polysilicon layer 105, a silicide layer 107, such as a $TiSi_x$ or $WSi_x$ layer, over the first polysilicon layer and a second P+ polysilicon layer 109 above the silicide layer. The gate line 103 acts as a gate electrode in each TFT. Thus, no separate gate electrodes connected to the gate lines are required.

A first insulating layer 111 is disposed adjacent to a first side of the gate electrode 103. This insulating layer 111 may be a conventional gate dielectric. If it is desired to form a mask ROM and an EEPROM in the same array of transistors, then the insulating layer 111 is preferably a charge storage layer, such as an ONO stack or isolated nanocrystals, to form charge storage CMOS TFTs, such as EEPROM CMOS TFTs. If floating gate type EEPROM CMOS TFTs are desired, then a floating gate and a control gate dielectric may be added between the insulating layer 111 and the gate line 103.

A p-type semiconductor layer 113, such as a P– polysilicon layer, is disposed on a side of the first insulating layer opposite to the gate 103. This layer contains the NMOS TFT bodies. N+ source and drain regions 115 are disposed in layer 113. The portions of layer 113 between regions 115 comprise NMOS TFT channel regions.

Preferably, the source and drain regions 115 are formed by outdiffusion of n-type dopants from the source and drain electrodes (i.e., bit lines) 117. However, regions 115 may be formed by any other method, such as by masking and ion implantation or may be omitted entirely. The electrodes 117 contact the source and drain regions 115 and are disposed on the bottom of the p-type semiconductor layer 113 (i.e., on the side of layer 113 opposite to the first insulating layer 111). Preferably, the electrodes 117 comprise N+ polysilicon rails which extend in a direction perpendicular to the gate line 103. If desired, an optional metal or metal silicide layer is formed in contact with electrodes 117 to increase their conductivity. However, the electrodes 117 may comprise metal or metal silicide instead of the heavily doped polysilicon, if desired. A planar insulating filler layer 118, such as silicon oxide, is disposed between the source and drain electrodes 117.

Thus, each NMOS TFT 119 is located between adjacent source and drain regions 115 and comprises a portion of layers 105, 111, 113 and 117, as illustrated in FIG. 5B. The PMOS TFTs 121 are located above the NMOS TFTs 119.

The PMOS TFTs 121 include a second insulating layer 123 adjacent to a second side of the gate electrode 103. In FIG. 5B, layer 123 is located on the P+ polysilicon layer 109 of the gate line 103. The insulating layer 123 may be a conventional gate dielectric. If it is desired to form a mask ROM and an EEPROM in the same array of transistors, then the insulating layer 123 is preferably a charge storage layer, such as an ONO stack or isolated nanocrystals, to form charge storage CMOS TFTs, such as EEPROM CMOS TFTs. If floating gate type EEPROM CMOS TFTs are desired, then a floating gate and a control gate dielectric may be added between the insulating layer 123 and the gate line 103.

An n-type semiconductor layer 125, such as an N–polysilicon layer, is disposed above the second insulating layer 123. Layer 125 is disposed on the opposite side of layer 123 from the gate electrode 103. P+ source and drain regions 127 are disposed in layer 125, such that regions of layer 125 between the source and drain regions 127 comprise channel regions of PMOS TFTs. Source and drain electrodes 129 are disposed over the N– polysilicon layer 125 and in contact with the source and drain regions 129. Thus, the electrodes 129 are disposed on top side of the N– polysilicon layer 125 opposite to the second insulating layer 123. A planar insulating filler layer 131, such as silicon oxide, is disposed between the source and drain electrodes 129. If desired, an optional metal or metal silicide layer is formed in contact with electrodes 129 to increase their conductivity.

Thus, each PMOS TFT 121 is located between adjacent source and drain regions 127 and comprises a portion of layers 109, 123, 125 and 129, as illustrated in FIG. 5B. The NMOS TFT 119 and the PMOS TFT 121 directly above it together comprise a TFT EEPROM CMOS device, which is an NMOS transistor and a PMOS transistor with a common gate electrode 103, and with each preferably using a charge storage medium for a gate dielectric. If desired, the CMOS structure may be inverted and the PMOS TFTs formed below NMOS TFTs. It should be noted that NMOS and PMOS electrodes (i.e., bit lines) do not have to fall directly on top of each other, although they preferably should have the same pitch. NMOS and PMOS transistors thus can have different channel lengths, but the pitch (and thus array size) will be limited by the longer of the two channel lengths. The TFT 119, 121 channel length is determined by the space between the adjacent rails 117 or 129. The array shown in FIG. 5B may be extended to a monolithic three dimensional array by forming additional device levels in the vertical direction with or without interlevel insulating layers, as shown in FIGS. 3, 4A–D or 5A.

The TFTs 119 and 121 comprise a first set of enabled TFTs and a second set of partially or totally disabled TFTs, as described with respect to FIG. 1. Thus, some NMOS TFTs are enabled while others are disabled using a mask. Likewise, some PMOS TFTs are enabled while others are disabled using a mask. In one preferred aspect, TFTs of one conductivity type (i.e., NMOS or PMOS TFTs) contain a charge storage layer or region, while TFTs of the other conductivity type (i.e., PMOS or NMOS) do not have a charge storage region or layer. Thus, the CMOS of this aspect comprises one EEPROM TFT and one non-EEPROM TFT. In this case the EEPROM is formed in the portion of the array containing charge storage TFTs.

As described above, the transistors in the mask ROM array preferably contain a charge storage region. Thus, the transistors for the mask ROM may also be used for an EEPROM. The transistors may comprise any type of TFTs or metal oxide semiconductor field effect transistors in a bulk silicon substrate. The addition of a charge storage region to transistors of a mask ROM array is particularly advantageous because it allows some cells in the array to be preprogrammed prior to packaging the array in the factory using the mask ROM techniques, while it allows other cells in the array to be programmed in the field after packaging the array using EEPROM programming techniques (such as hot carrier injection or Fowler-Nordheim tunneling). The two stage programming of the array is advantageous because it improves the flexibility of the device processing. For example, the standard cells in the array may be preprogrammed in the factory, while the user-desired cells may be preprogrammed in the field by the user. However, since the mask ROM and the EEPROM are formed in the same array of transistors containing a charge storage region, the manufacturing costs are decreased, since separate mask ROM and EEPROM transistors do not have to be fabricated.

Figure 6:
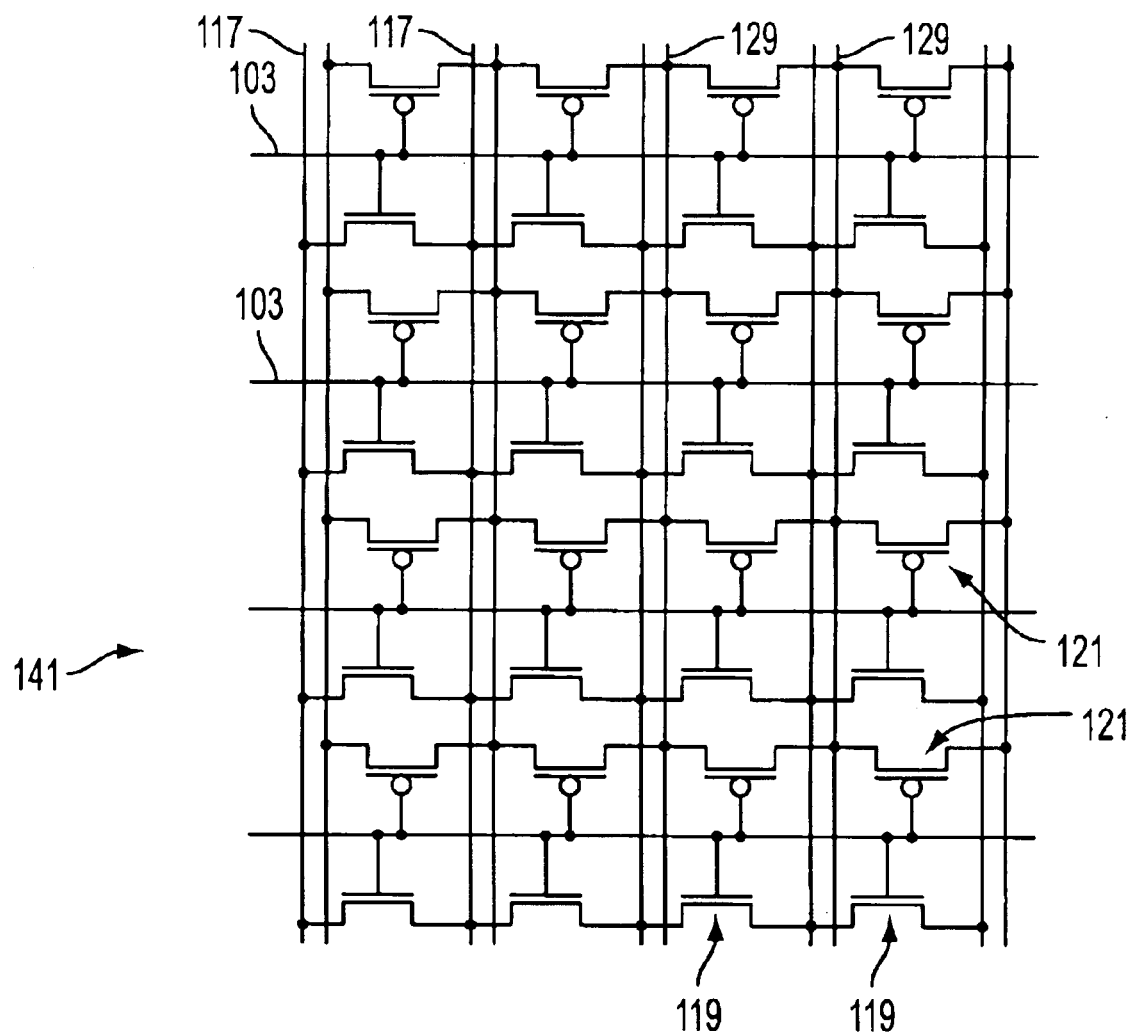
FIGS. 6–8 are circuit schematics of an array according to a preferred embodiment of the present invention.

An example of two stage programming is illustrated using an static random access memory (SRAM) preprogrammed by mask ROM techniques and a logic gate programmed in the field. FIG. 6 illustrates a circuit schematic of an unprogrammed TFT CMOS array 100 of FIG. 5B. The array 100 is a matrix of NMOS 119 and PMOS 121 devices with common gates 103. In one portion of the array 100, a 5×6 SRAM cell 180 is formed by mask ROM preprogramming, as described with reference to FIGS. 5 and 7. The programming process comprises the following steps.

First, the rails 117 and the p-type semiconductor layer 113 are formed. Then, a first mask is formed over layer 113 of all NMOS TFTs 119 in the circuit of FIG. 7, before the charge storage layer 111 is formed on layer 113. The mask covers regions where NMOS access transistors 189 and 190 and NMOS inverter transistors 191 and 192 will be formed. The channel portions of layer 113 in areas where the other NMOS transistors will be formed is etched such the other NMOS TFTs 119, 150 in FIGS. 5 and 7, respectively, are disabled.

Second, the first charge storage layer 111 is formed over the patterned layer 113. A second mask is formed over layer 111. Layer 111 is removed at locations 148 in FIG. 7. The gate line 103 is then formed on the patterned layer 111. Since layer 113 is removed at locations 148, the gate lines (103 in FIG. 5B, 181 and 183 in FIG. 7) are shorted to the source and drain rails (117 in FIG. 5B, 185, 187 in FIG. 7) at locations 148.

The second charge storage layer 123 is then formed on the gate line 103. A third mask is formed over layer 123. Layer 123 is removed at locations 148 in FIG. 7.

The n-type semiconductor layer 125 is then formed over the patterned layer 123. A fourth mask is formed over layer 125. The mask covers regions where PMOS inverter transistors 193 and 194 will be formed. The channel regions of layer 125 in areas where the other PMOS transistors will be formed is etched such the other PMOS TFTs 121, 150 in FIGS. 5 and 7, respectively, are disabled.

The rails 129 are formed over the patterned layer 125. Since layers 123 and 125 are removed at locations 148 in FIG. 7, the gate lines (103 in FIG. 5B, 181 and 183 in FIG. 7) are shorted to the source and drain rails (129 in FIG. 5B, 186, 188 in FIG. 7) at locations 148.

Figure 7:
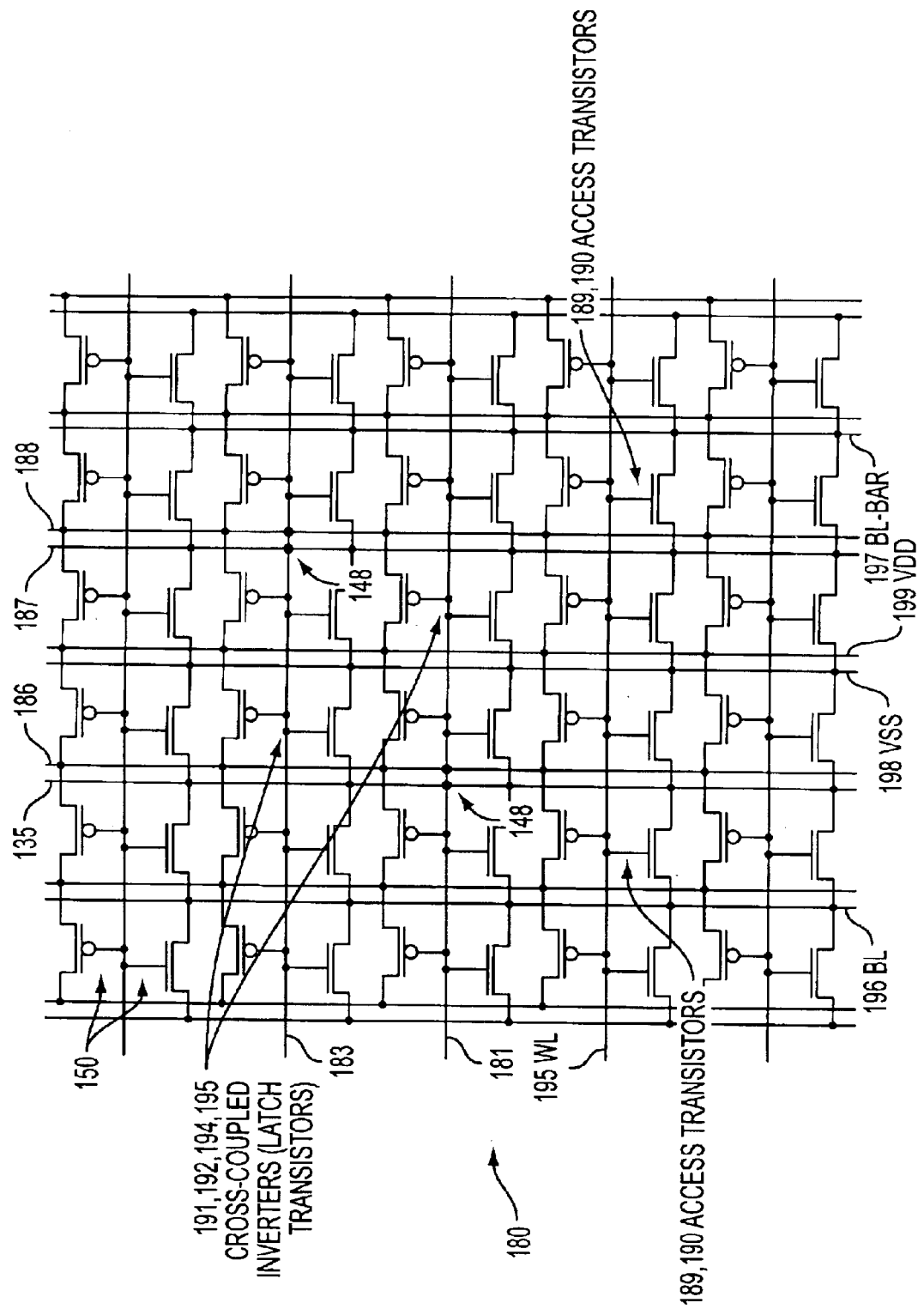

Thus, a 5×6 SRAM cell 180 is formed, as shown in FIG. 7. In the SRAM cell, the transistors 189 and 190 are the SRAM access transistors, while transistors 191, 192, 193 and 194 are the cross coupled inverters. The cell is accessed by placing a positive voltage on the word line 195. Data is input onto and read out of BL and BL-bar, which are provided into bit lines 196 and 197, respectively. Voltages $V_{SS}$ and $V_{DD}$ are provided into bit lines 198 and 199, respectively.

Since all of the "links" (gate/bitline shorts) and the "antilinks" (removed channels) are formed prior to field programming, all of the linkable nodes do not have to be brought out of the array. This allows a 6 transistor SRAM bit cell with an area of about $80F^2$ to be made.

Figure 8:
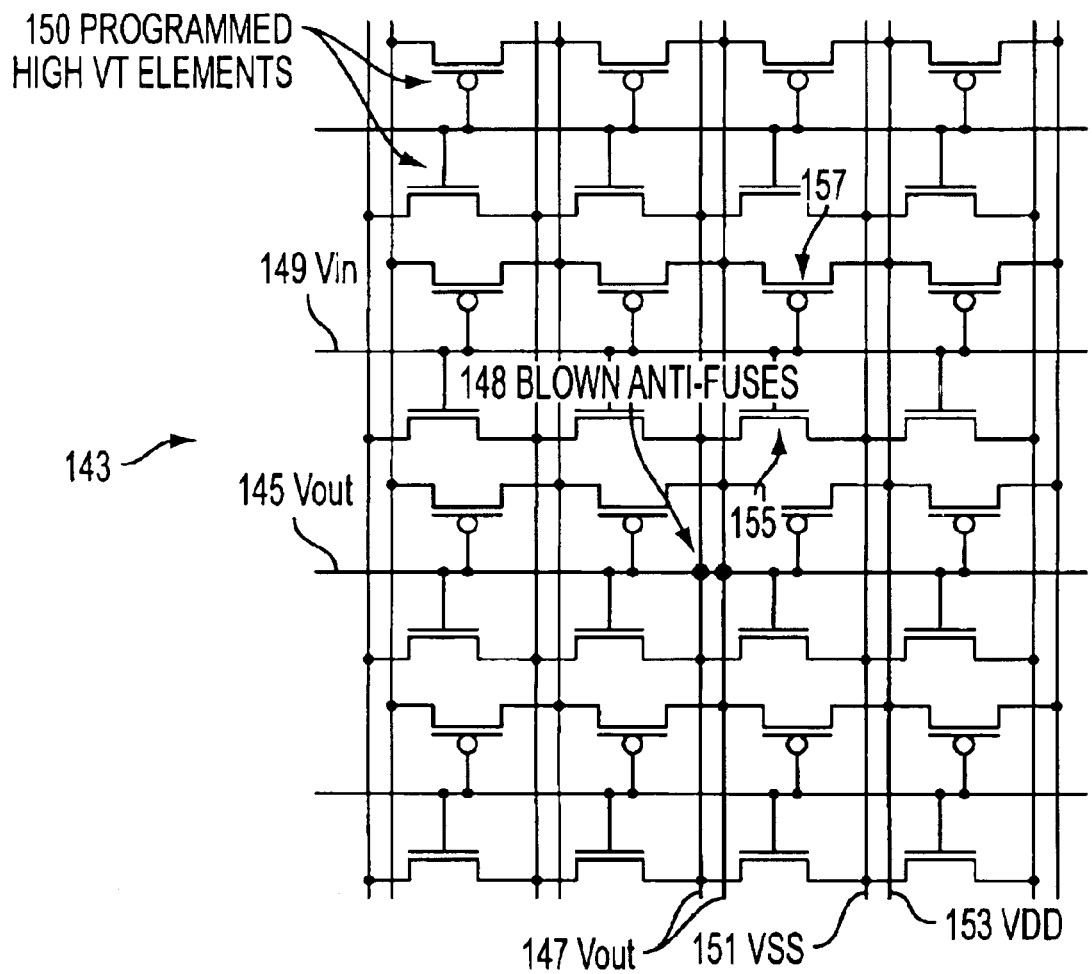

After the SRAM 180 is preprogrammed, one or more logic devices, such as inverters, NAND gates and/or NOR gates are programmed in the field by the end user. The logic devices may be programmed by EEPROM and/or antifuse programming techniques (i.e., where a link between the gate and source or drain region is formed). As shown in FIG. 8, another portion of the unprogrammed array 100 is programmed to form a 4×4 inverter cell 143. This portion may be laterally spaced from the SRAM 180 or it may be located in another device level, if the array comprises a three dimensional array.

First, a high voltage is applied between gate (i.e., word) line 145 and bit lines 147, which will be used to carry the output voltage, $V_{out}$. This causes conductive antifuse links 148 to form to electrically connect lines 145 and 147. Then, the driver circuit provides a programming voltage to all other transistors 150 to increase their threshold voltage to turn them off, except to NMOS transistors 155 and PMOS transistors 157. The NMOS 155 and PMOS 157 transistors form the inverter. When a high voltage, $V_{in}$, is provided into gate line 149, then a low voltage, $V_{out}$, is read out, and vice-versa. Voltages $V_{SS}$ (i.e., ground) and $V_{DD}$ (i.e., power supply voltage) are provided into bit lines 151 and 153 which are connected to transistors 155 and 157.

Thus, the array contains a plurality of TFTs with charge storage regions, some of which are programmed by mask ROM techniques, others by EEPROM techniques, while yet others are programmed by anti-fuse techniques. Thus, the array programming flexibility is increased while its cost is reduced because all the transistors in the array are the same.

In the above described preferred embodiments, the use of polysilicon layers was described. However, amorphous silicon, single crystal silicon or non-silicon semiconductor materials may be used instead. The polysilicon layers described above may be deposited as polysilicon layers by chemical vapor deposition (CVD) or other methods. The semiconductor layers may be in-situ doped during deposition or these layers may be doped by ion implantation or diffusion after deposition. Furthermore, the polysilicon layers, such as the channel layer, may be first deposited as amorphous silicon layers and then crystallized to form polysilicon or single crystal silicon layers. The crystallization may be carried out by laser, flash lamp and/or thermal (i.e., furnace) annealing. If desired, a transition metal or germanium crystallization catalyst material may be placed in contact with the amorphous silicon layers to increase the polysilicon grain size after the crystallization. Such transition catalyst materials may comprise nickel, cobalt, platinum, palladium and other transition metals. The insulating and conductive layers described above may be deposited by any known method, such as CVD, sputtering, plating, spin-on coating (for spin-on glass), etc.

In the various embodiments described above, metal silicide layers were formed in contact with silicon layers, such as the polysilicon source and drain regions or gate electrodes. One preferred method of forming a metal silicide layer, such as a titanium silicide layer, in contact with a silicon layer is by using a silicon cap and a TiN layer. The titanium silicide layer is formed on an undoped amorphous silicon cap layer. The cap layer is formed on a heavily doped silicon layer, such as a polysilicon or amorphous silicon layer doped to a concentration in excess of $10^{19}$ cm$^{-3}$, such as $10^{19}$ cm$^{-3}$ to $10^{21}$ cm$^{-3}$. The cap layer is preferably deposited on P+ polysilicon or N+ amorphous silicon layers. The N+ amorphous silicon may then be recrystallized into N+ polysilicon during subsequent annealing steps.

A method of forming a titanium silicide (TiSi$_2$) layer comprises the following steps. A heavily doped polysilicon layer is deposited. For example, a P+ polysilicon layer is boron doped to a concentration of $5 \times 10^{20}$ cm$^{-3}$, and has a thickness of about 1400 Angstroms. A cap layer of undoped amorphous silicon is deposited on the P+ polysilicon layer. The cap may be 600 Angstroms thick, for example. A titanium layer is deposited on the cap. The titanium layer may be 250 Angstroms thick, for example. A titanium nitride layer is deposited on the titanium layer. The titanium nitride layer may be 100 Angstroms thick, for example. Other layer thicknesses may be used, as required.

The layers are annealed at a temperature below 650° C. for less than five minutes to react the titanium and the silicon in the cap to form a C49 phase TiSi$_2$ layer. The anneal may be carried out at 600° C. for 1 minute, for example. If desired, another P+ polysilicon layer is deposited over the stack and the stack is etched into a thin "wire" or "rail", such as a word line or bit line. The wire or rail may be 0.25 microns wide or less. The titanium silicide is then transformed from the C49 to the C54 phase by a high temperature (i.e., above 650° C.) anneal. The anneal can take place before or after the wires or rails are patterned, at 800° C. for one minute, for example. By annealing each Si/Ti/TiN film stack below 650° C., dopant diffusion and thermal grooving of the TiSi$_2$ is minimized. Multiple film stacks can be deposited and etched sequentially.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. The drawings are not necessarily to scale and illustrate the device in schematic block format. It is intended that the scope of the invention be defined by the claims appended hereto, and their equivalents.

What is claimed:

1. A monolithic three dimensional TFT mask ROM array, comprising a plurality of device levels, wherein each device level of the plurality of device levels comprises a first set of enabled TFTs and a second set of partially or totally disabled TFTs.

2. The array of claim 1, further comprising at least one interlevel insulating layer located between adjacent device levels.

3. The array of claim 1, wherein adjacent device levels contact each other.

4. The array of claim 1, wherein the second set of TFTs comprises a set of totally disabled TFTs.

5. The array of claim 1, wherein the second set of TFTs comprises a plurality of totally disabled TFTs and a plurality of partially disabled TFTs.

6. The array of claim 1, wherein at least a portion of channel regions of the partially or totally disabled TFTs of the second set have been selectively removed or selectively doped to increase a threshold voltage of said TFTs to render said TFTs partially or totally inoperative.

7. The array of claim 1, wherein:
at least a portion of channel regions of a first subset of the TFTs of the second set have been selectively removed to render the first subset of the TFTs totally inoperative; and
at least a portion of channel regions of a second subset of the TFTs of the second set have been selectively doped to increase a threshold voltage of said TFTs to render said TFTs partially inoperative.

8. The array of claim 1, wherein:
at least a portion of channel regions of a first subset of the TFTs of the second set have been selectively doped to increase a threshold voltage of said TFTs to render said TFTs totally inoperative; and
at least a portion of channel regions of a second subset of the TFTs of the second set have been selectively doped to increase a threshold voltage of said TFTs to render said TFTs partially inoperative.

9. The array of claim 1, wherein the array comprises:
a substrate;
a first device level over the substrate;
a first interlevel insulating layer over the first device level; and
a second device level over the first interlevel insulating layer.

10. The array of claim 9, further comprising:
a second interlevel insulating layer over the second device level;
a third device level over the second interlevel insulating layer;
a third interlevel insulating layer over the third device level; and
a fourth device level over the third interlevel insulating layer.

11. The array of claim 9, wherein:
the TFTs are selected from one or more of top gate co-planar TFTs, top gate staggered TFTs, bottom gate co-planar TFTs and bottom gate staggered TFTs; and
an effective cell area of the array is $4F^2/N$, where F is a minimum feature size and N is a number of device levels.

12. The array of claim 9, further comprising:
a first plurality of spaced apart conductors disposed at a first height above the substrate in a first direction;
a second plurality of spaced apart rail stacks disposed at a second height in a second direction different from the first direction, each rail stack including:
a first semiconductor layer whose first surface is in contact with said first plurality of spaced apart conductors;
a conductive film; and
a gate insulating film disposed between a second surface of the first semiconductor layer and the conductive film; and
wherein the TFTs are formed at intersections of two adjacent first rails and the second rail stack, such that the conductive film comprises a gate of the TFTs, portions of the first semiconductor layer comprise TFT channel regions and the first rails comprise at least a portion of the TFT source and drain regions.

13. A method of making a monolithic three dimensional TFT mask ROM array, comprising:
forming a first device level comprising a plurality of TFTs over a substrate;
forming a first mask over the first device level;
partially or totally disabling a first set of TFTs in the first device level;
forming a second device level comprising a plurality of TFTs over the first device level;
forming a second mask over the second device level; and
partially or totally disabling a second set of TFTs in the second device level;
wherein:
the array comprises a plurality of device levels; and
each device level of the plurality of device levels comprises a first set of enabled TFTs and a second set of partially or totally disabled TFTs.

14. The array of claim 13, further comprising forming a first interlevel insulating layer between the first device level and the second device level.

15. The array of claim 13, wherein the second device level is formed directly on the first device level.

16. The method of claim 13, wherein the first and the second sets of TFTs are totally disabled.

17. The method of claim 13, wherein some TFTs are partially disabled and other TFTs are totally disabled.

18. The method of claim 13, wherein:
the step of forming the first mask over the first device level comprises forming a photoresist layer over a semiconductor channel layer in the first device level;
the step of forming the second mask over the second device level comprises forming a photoresist layer over a semiconductor channel layer in the second device level; and
the steps of disabling comprise selectively etching at least a portion of the semiconductor channel layer exposed through the first or the second mask or selectively doping at least a portion of the semiconductor channel layer exposed through the first or the second mask.

19. The method of claim 13, further comprising:

selectively etching at least a portion of channel regions of a first plurality of TFTs exposed through the first or the second mask to totally disable the first plurality of TFTs; and selectively doping at least a portion of channel regions of a second plurality of TFTs exposed through the other of the first or the second mask to partially disable the second plurality of TFTs.

20. The method of claim 13, further comprising:

selectively doping at least a portion of channel regions of a first plurality of TFTs exposed through the first or the second mask to totally disable the first plurality of TFTs; and selectively doping at least a portion of channel regions of a second plurality of TFTs exposed through the first or the second mask to partially disable the second plurality of TFTs.

21. The method of claim 13, wherein the TFTs are selected from one or more of top gate co-planar TFTs, top gate staggered TFTs, bottom gate co-planar TFTs and bottom gate staggered TFTs.

22. The method of claim 13, wherein the step of forming the first device level comprises:

forming a first plurality of spaced apart conductors disposed at a first height above the substrate in a first direction;

forming a first insulating layer over the first conductors;

planarizing the first insulating layer, such that the first insulating layer is located between the first conductors;

forming a first semiconductor layer whose first surface is in contact with said first plurality of spaced apart conductors;

forming a conductive film;

forming a gate insulating film disposed between a second surface of the first semiconductor layer and the conductive film; and patterning the first semiconductor layer, the gate insulating film and the conductive film to form a second plurality of spaced apart rail stacks disposed at a second height in a second direction different from the first direction.

23. The method of claim 22, wherein:

the first plurality of conductors comprise first rails comprising polysilicon layers in contact with metal or a metal silicide layers;

the first semiconductor layer comprises a polysilicon layer;

the gate insulating layer comprises a portion of a charge storage region;

the conductive film comprises a polysilicon layer and a metal silicide layer; and the TFTs are formed at intersections of two adjacent first rails and the second rail stack, such that the conductive film comprises a gate of the TFTs, portions of the first semiconductor layer comprise TFT channel regions and the polysilicon layers of the first rails comprise at least a portion of the TFT source and drain regions.

24. The method of 23, claim wherein the step of disabling a first set of TFTs in the first device level comprises forming a mask over the first semiconductor layer and selectively etching unmasked portions of the first semiconductor layer or selectively implanting ions into unmasked portions of the first semiconductor layer.

* * * * *